United States Patent [19]
Higgins

[11] Patent Number: 5,363,073
[45] Date of Patent: Nov. 8, 1994

[54] SAW RESONATOR FILTER WITH A MULTISTRIP COUPLER DISPOSED IN THE RESONATOR GAPS

[75] Inventor: Jr. Higgins, Plantation, Fla.

[73] Assignee: Motorola, Inc., Schaumburg, Ill.

[21] Appl. No.: 963,191

[22] Filed: Oct. 19, 1992

[51] Int. Cl.$^5$ .............................................. H03H 9/64
[52] U.S. Cl. .................. 333/195; 310/313 B; 310/313 D
[58] Field of Search ............... 333/193, 195, 153, 154; 310/313 R, 313 B, 313 C, 313 D

[56] References Cited

U.S. PATENT DOCUMENTS

| | | | |
|---|---|---|---|
| 4,350,963 | 9/1982 | Iwamoto et al. | 310/313 D X |
| 4,370,633 | 1/1983 | Schofield | 333/195 |
| 4,427,956 | 1/1984 | Murray et al. | 333/195 X |
| 4,510,471 | 4/1985 | Flinn et al. | 333/196 X |
| 4,659,955 | 4/1987 | Schofield | 333/195 X |
| 4,731,595 | 3/1988 | Wright | 310/313 D X |

FOREIGN PATENT DOCUMENTS 97004  4/1988  Japan ................... 333/195

*Primary Examiner*—Benny Lee
*Attorney, Agent, or Firm*—Daniel K. Nichols; Andrew S. Fuller

[57] ABSTRACT

A SAW filter structure (300) includes two SAW resonators being symmetrically positioned along parallel tracks. The resonators include centrally positioned resonator gaps (368, 378) which are opposingly positioned. A multistrip coupler (330) for acoustically coupling the resonators extends between the resonator gaps and includes a plurality of equally spaced strips (8812) which are spaced to permit omni-directional projection of acoustic waves from the opposing sides of the multi strip coupler.

14 Claims, 3 Drawing Sheets

SAW RESONATOR FILTER WITH A MULTISTRIP COUPLER DISPOSED IN THE RESONATOR GAPS

CROSS REFERENCE TO REATED APPLICATIONS

This application is being cross-referenced to co-pending U.S. application Ser. No. 963,190, filed Oct. 19, 1992, by Higgins, and assigned to Motorola, Inc.

TECHNICAL FIELD

This invention relates generally to Surface Acoustic Wave (SAW) structures and more particularly to SAW filter structures.

BACKGROUND

SAW components use acoustic waves which travel at the speed of sound. The SAW components are preferred over widely used transmission line components because acoustic waves have a substantially shorter wave length at operating frequency than electromagnetic waves which travel at the speed of light. Therefore, for a given operating frequency, a SAW resonator filter provides a smaller sized structure than a transmission line structure, therefore, making them suitable for miniaturized radio frequency applications. Furthermore, SAW structures are easily integratable with other active circuits, such as amplifiers and mixers, which are produced using conventional integrated circuit technologies. For the above reasons, the popularity of SAW structures in radio frequency applications, especially in resonator filter applications, has been steadily increasing.

FIG. 1 depicts the diagram of a conventional single track SAW filter structure 100 comprising SAW transducers 110 and 120 and reflectors 130, 140 and 150 disposed on a piezoelectric substrate 105. The filter 100 is characterized by two resonators 180 and 190 which are positioned on a single track (shown on FIG. 1 as being separated by dotted line) and are resonant at a resonator frequency. As illustrated, the transducer 110 is an input transducer being coupled to a source 195 having a source impedance $R_S$ and the transducer 120 is an output transducer which is coupled to a load $R_L$. Resonator 180 includes the transducer 110 and the reflectors 130, and the resonator 190 includes the transducer 120 and reflectors 150. The input and the output transducers 110 and 120 each include a plurality of interdigitated open-ended fingers 114 having a center-to-center spacing equal to $\frac{1}{2}$ the wave length at the resonator frequency. In the filter 100, the reflector 140 is shared by the resonators 180 and 190 and, by leakage, provides the in-band coupling between them.

However, the SAW filter 100 suffers from poor selectivity and out-of-band response. This is because the reflectors 130, 140, and 150 have reflectivity in only a small band around a center frequency and outside of this band the acoustic waves propagate freely due to lack of reflectivity. The lack of out-of-band reflectivity causes direct coupling between the input transducer 110 and the output transducer 120, thus degrading the overall frequency response of the SAW filter.

In order to resolve the out-of-band response problem of the single track filter arrangement, one prior art approach utilizes a dual track filter arrangement. Referring to FIG. 2, one such dual track SAW filter 200 is shown. The filter 200 includes a first resonator 210 and a second resonator 220 which are symmetrically positioned along a common conductive track 230. This arrangement relies on longitudinal coupling provided by the common track 230 for achieving acoustic coupling between the first and the second resonators 210 and 220. In this dual track arrangement, direct out-of-band coupling encountered with the SAW filter 100 is avoided. However, since the acoustic waves propagating within the resonators 210 and 220 travel along two substantially separate and parallel tracks, the acoustic coupling provided by this arrangement is very small and unpredictable. Thus, filter design necessarily leads to a trial and error process, the result of which does not satisfy applications where large acoustic coupling are needed.

Therefore, it is desired to design a SAW filter with a significantly improved out-of-band response which avoids the drawbacks encountered in prior art approaches.

SUMMARY OF THE INVENTION

Briefly, according to the invention, there is provided a surface acoustic wave (SAW) filter having two symmetrically positioned resonators which are disposed on two separate and parallel tracks. Each resonator includes conductive portions having a plurality of interdigitated fingers which are separated from each other by a resonator gap. A multistrip coupler which acoustically couples the resonators to each other is positioned between the resonator gaps such that the resonator conductive portions are positioned on each of its opposing sides. The multistrip coupler has a plurality of equally spaced strips extending between the resonator gaps. The strips are spaced such that the coupled acoustic waves propagate omni-directionally from both of the opposing sides of the multistrip coupler and travel along the conductive portions of the resonators.

DETAILED DESCRIPTION OF THE PREFERRED EMBODIMENT

Figure 1:
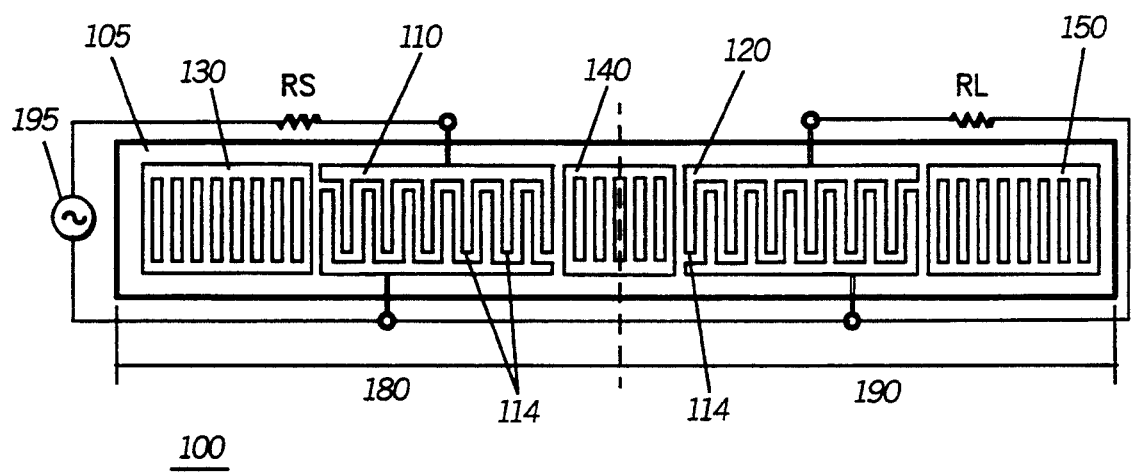
FIG. 1 is a top plan view of a prior art SAW filter.
Figure 2:
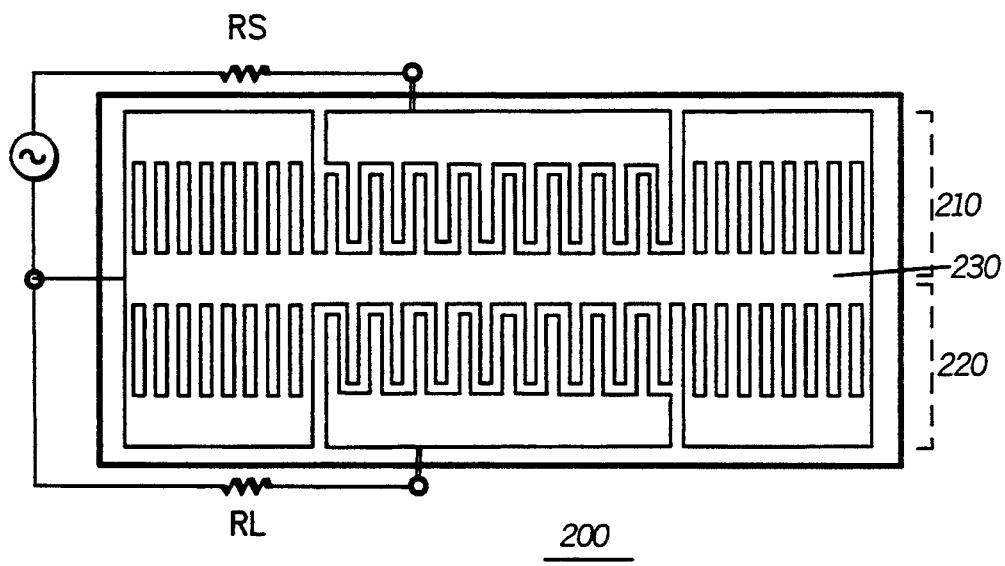
FIG. 2 is a top plan view of another prior art SAW filter.
Figure 3:
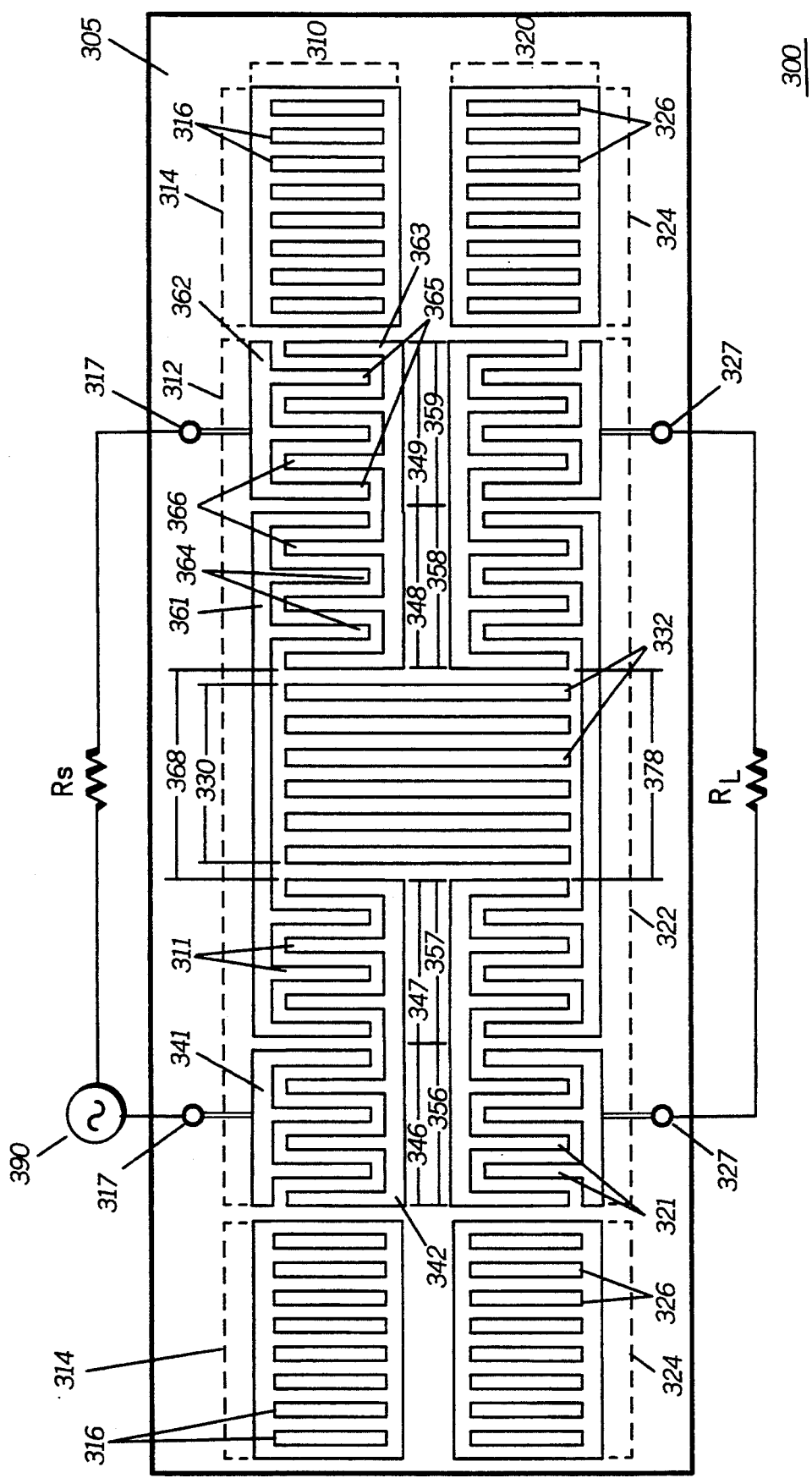
FIG. 3 is a top plan view of a SAW filter according to the present invention.

Referring to FIG. 3, a top plan view of a SAW structure 300 configured to provide a substantially improved out-of-band response is shown. In one contemplated application, the SAW filter 300 provides front-end receiver selectivity for a land mobile communication unit. As such, the SAW filter 300 is a bandpass filter comprising a first resonator 310 and a second resonator 320 which are acoustically coupled to each other by a multistrip coupler (MSC) 330. The resonators 310 and 320 are resonant at a resonant frequency and upon being acoustically coupled to each other, a wideband frequency response is provided by the SAW filter 300.

The SAW filter 300 is comprised of a piezoelectric substrate 305 upon which conductive patterns constituting the resonators 310 and 320 and the MSC 330 are disposed. The substrate 305 is made of suitable piezoelectric material such as quartz, lithium niobate, or lithium tantalate, which possess the appropriate properties for producing a desired wideband frequency response when the conductive patterns of the resonators 310 and 320 and the MSC 330 are disposed. The conductive patterns may be disposed on the piezoelectric substrate 305, utilizing any number of suitable techniques, such as thin film or thick film processes.

The first resonator 310 includes a transducer 312 having terminals 317 which provide the input port of the SAW filter 300. In radio frequency applications, it is often necessary to terminate an active stage by a passive filter. For example, in the front end receiver, an active stage such as a pre-amplifier stage is usually terminated by a passband selectivity filter. As shown, the SAW filter 300 includes an input port comprising terminals 317 which couple to an active stage which is represented by a source 390 and a source impedance Rs. A pair of reflectors 314 are positioned on opposite sides of the transducer 312 such that the transducer 312 is centrally positioned between the reflectors 314. The reflectors 314 are formed by patterning a plurality of equally spaced, parallel conductive traces 316 which, at each end, are consecutively shorted to each other. As described later in detail, the transducer 312 is patterned to include interdigitated open ended fingers 311 which are equally spaced according to the resonant frequency of the resonator 310. The center-to-center spacing of the interdigitated fingers corresponds to the resonant frequency of the resonators 310 and 320 and is equal to $\frac{1}{2}$ the wave length of the resonant frequency. The second resonator 320 also includes a transducer 322 and oppositely positioned reflector patterns 324 which are patterned similar to those of the first resonator 310. The second resonator 320 and the reflectors 324 respectively include equally spaced interdigitated fingers 321 and equally spaced traces 326 which are correspondingly patterned to produce the desired frequency response for the filter 300. The transducer 322 has an output termination port comprising terminals 327 which are coupled to an load $R_L$ representing termination impedance of a subsequent active or passive stage.

Conventional SAW resonator filters have an inherently narrow bandwidth when designed for resistive termination. The bandwidth is limited because of the low piezoelectric coupling coefficient of most substrates. However, in some radio frequency applications such as those used for receiver selectivity, a substantially wide bandwidth is desired. In order to achieve the widest possible bandwidth, it is necessary to provide large numbers of fingers in the transducer portion of the SAW filter. It is well known that the widest bandwidth is achieved with the resistive source load Rs whose resistance is equal to the capacitive reactance at the desired operating frequency of the capacitors formed by the interdigitated fingers of the transducer portion. Therefore, the increased number of fingers widens the bandwidth of the structure filter. As the number of interdigitated fingers increases, so does the interdigital capacitance between the fingers, thereby reducing the termination impedance. However, when the SAW structure terminates an active stage, it is very desirable to have a high termination impedance in order to realize a high active stage gain utilizing very little bias current drain. The current drain is an important parameter in miniaturized receivers where SAW structures are used. Therefore, it is desired to achieve the widest bandwidth in a SAW filter structure while presenting a sufficiently high termination impedance.

The termination impedance of the SAW filter 300 is increased by patterning the transducer 312 to include a plurality of acoustically coupled sub-transducers 346, 347, 348, 349, the electrodes of which are electrically coupled to each other in series. The term sub-transducer, as described herein, refers to a transducer portion which includes a pair of acoustically coupled SAW electrodes having interdigitated fingers such as electrodes 341 and 342 of the sub-transducer 346. The term electrode, as described herein, defines an electrically isolated conductor disposed on piezoelectric substrate 305, optionally connected to an external circuit. In the SAW filter structure 300, when an alternating electrical voltage is applied between the electrodes 341 and 342, a corresponding acoustic wave is induced. The acoustic wave so induced travels on or near the surface of the substrate 305. The same phenomena occurs across the electrodes of the sub-transducers 347, 348, 349 for converting electrical signals to acoustical waves and vice versa. Serial connection between the sub-transducers 346, 347, 348, 349 is produced by electrically coupling their electrodes such that the alternating current flowing through electrodes of one also flows directly through the electrodes of other sub-transducers.

As a result, of serial connection of the sub-transducers 346, 347, 348, 349, termination impedance is increased because the source voltage Vs gets divided across the sub-transducers 346, 347, thereby decreasing the current through the sub-transducers which translates into an impedance increase at the port termination.

As illustrated, the transducer 312 is comprised of at least two serially coupled sub-traducers pairs: a first pair comprising serially coupled sub-transducers 346, 347, and a second pair comprising subtransducers 348, 349. Each sub-transducer pair, for example the second sub-transducer pair 348, 349, includes a first conductive pattern 361 having a first set of fingers 364, a second conductive pattern 362 having a second set of fingers 365, and a third conductive pattern 363 having a third set of fingers 366, wherein the serial electrical coupling between the subtransducers of each pair is provided by positioning the outermost finger of the first set of fingers 364 and the outermost finger of the second set of fingers 365 between a pair of adjacent fingers of the third set of fingers 366. The first pair of sub-transducers 346, 347 and the second pair subtransducers 348, 349 are serially coupled to each other by providing an extended direct connection between adjacent conductive patterns of each pair so as to produce a first resonator gap 368 with no fingers disposed therewithin. As arranged, the first pair of sub-transducers 346, 347 and the second pair of sub-transducers 348, 349 are approximately symmetrically positioned on the substrate 305 such that the first resonator gap 368 is centrally positioned along the length of the resonator 310. As such, the first resonator 310 includes at least two conductive portions comprising the first resonator pair 346, 347 and the second resonator pair 348, 349 with a plurality of equally spaced interdigitated open-ended fingers, wherein the conductive portions are separated from each other by the resonator gap 368.

Similarly, as illustrated, the second resonator 320 has a substantially similar pattern except that it is positioned to be in a horizontally symmetrical orientation with respect to the first resonator 310. Thus, the second resonator 320 also includes at least two serially coupled sub-transducer pairs 356, 357 and 358, 359 which are separated from each other by a second resonator gap 378. The first resonator 310 and the second resonator 320 are also positioned on the substrate 305 such that the first resonator gap 368 and the second resonator gap 378 are situated opposite each other. It may be appreciated that, as arranged, the propagating acoustic waves within the first and the second resonators 310 and 320 travel along two separate and substantially parallel acoustic tracks. Thus, acoustic interference between the first resonator 310 and the second resonator 320 is avoided, thereby preventing out-of-band response degradation as encountered in some conventional SAW filter designs.

The resonators 310 and 320 are acoustically coupled to each other via the centrally positioned MSC 330. The MSC 330 includes a plurality of equally spaced strips 332 which are longitudinally extended between the first resonator gap 368 and the second resonator gap 378, as shown. The majority of prior art MSC designs are well known to provide a unidirectional acoustic coupling between two or more SAW elements, e.g., SAW resonators. Prior art MSC coupling also produces acoustic propagation track shifting. For example, an acoustic wave entering from the top right hand side of the MSC projects or propagates from the bottom left hand side and vice versa. Similarly, an acoustic wave entering from the top left hand side is projected from the bottom right hand side and vice versa. The unidirectional coupling and track shifting property of the conventional MSC design is provided by coupling the MSC to external SAW components in a non-synchronous manner which generally requires spacing the parallel strips of the MSC within a range of ⅛ to ¼ of resonant frequency wave length. Furthermore, the number of parallel strips of the conventional MSC is selected based on the coupling factor of the piezoelectric substrate and such selection is generally independent from the amount of coupling desired between the MSC and the external SAW components.

However, the applicant in the present invention specifically contemplates utilizing a synchronous coupling mode, a mode generally avoided in prior art designs, to omni-directionally couple the MSC 330 to the resonators 310 and 320. According to the invention, acoustic coupling between the resonators is adjusted: first by selecting the number of the MSC strips according to the amount of desired coupling, and second by spacing the parallel strips 332 such that the MSC 330 is synchronously coupled to the transducer portions 312 and 322. In order to provide the synchronous acoustic coupling, center-to-center spacing between the parallel strips 332 is selected to be equal to the center-to-center spacing between the interdigitated fingers of the resonators 310 and 320. In other words, the spacing of the parallel strips 332 are equal to one-half the wave length at the resonant frequency. Operationally, the acoustic waves induced by the first resonator 310 are omni-directionally coupled to the second resonator 320 such that coupled acoustic waves project from the opposing sides of the multistrip coupler 330 and travel along the conductive portions of the resonator 320, i.e., the sub-transducer pair 356 and 357 and the sub-transducer pair 358 and 359.

Figure 4:
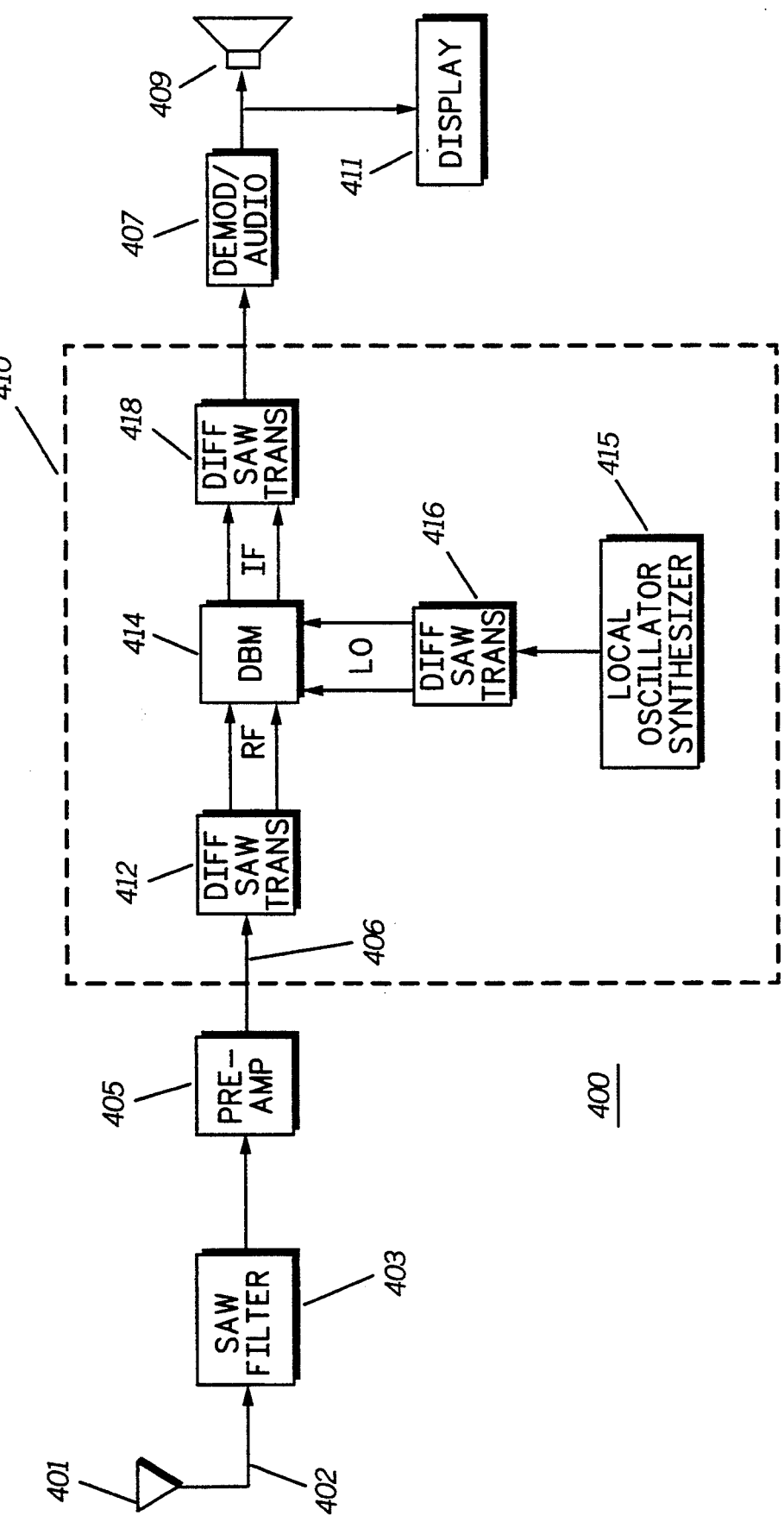
FIG. 4 is a block diagram of a receiver which includes the SAW filter of FIG. 3.

Referring to FIG. 4, a block diagram of a receiver 400, which includes the surface acoustic wave structure of the present invention, is shown. The receiver 400 is an FM receiver which operates in a well-known manner to receive communication signals. Alternatively, the receiver 400 when combined with a transmitter (not shown), provides a transceiver unit for communicating communication signals with another two-way transceiver unit.

The present invention contemplates utilizing surface acoustic wave (SAW) technology for processing the communication signals. The processing of the communication signals includes performing such functions as frequency filtering, phase splitting and transformation.

In the receiver 400, a radio frequency (RF) signal 402 carrying a communicated message is received via an antenna 401. The RF signal 402 is applied to a filter 403 which comprises a SAW bandpass filter to provide the initial selectivity for the receiver 400. An amplifier 405 amplifies the output of the filter 403 and couples it to an IF stage 410. The IF stage 410 is a balanced IF stage which includes SAW balanced network which couples to differential input(s) and differential output(s) of the balanced mixer 414. The IF stage 410 includes SAW transformers 412, 416 and 418 as well as a mixer 414. The mixer 414 is double balanced, having a pair of RF inputs, a pair of LO inputs and a pair of IF outputs. The RF and LO input pairs and the IF output pair comprise balanced differential ports which may receive two differential inputs and provide a single output and vice-versa, that is, receive single input and provide two differential outputs. It may be appreciated that the SAW filter 403 and the amplifier 405 and IF stages transformation and mixer combination may be integrated on a single substrate using both SAW and conventional IC technologies. The SAW transformer 412 receives output of the amplifier 405 at its input and provides outputs which are 180 degrees out of phase with each other. The outputs of the SAW transformer 412 are applied to RF inputs of the mixer 414 which also receives outputs of a SAW transformer 416 at its (local oscillator) LO inputs. The SAW transformer 416 receives a single LO input from a well-known frequency synthesizer 415 generating the local oscillator frequency for the receiver 400. The mixer 214 provides a differential IF output which is applied to differential inputs of the SAW transformer 418. The SAW transformer 418 operates in reverse of the SAW transformers 412 and 416 in that it receives a differential input and provides a single output. The output of the SAW transformer 418 which comprises the IF signal for the receiver 400, is applied to a well-known demodulator/audio circuitry 407 to recover the communicated message. If the communicated message has an audio component, the audio message is rendered audible through a speaker 409. If the communicated message comprises a data message, it is displayed via a display device 411.

Thus, as described above, the SAW filter of the present invention improves frequency response by providing a dual track resonator arrangement which eliminates the out-of-band response degradation encountered by single track resonator arrangement. Furthermore, the present invention provides substantial and predictable acoustical coupling by spacing the parallel strips of the MSC to provide a substantial omni-directional coupling between the resonators.

What is claimed is:

1. A surface acoustic wave (SAW) filter, comprising:
   a piezoelectric substrate;
   at least two SAW resonators disposed on said piezoelectric substrate, each resonator having a resonant surface acoustic wave structure including a plurality of equally spaced interdigitated fingers; and
   a multistrip coupler, disposed on said piezoelectric substrate, for acoustically coupling said resonators, said multistrip coupler including a plurality of parallel conductive strips, said conductive strips having an equal spacing between said strips which is substantially equal to a spacing between the equally spaced interdigitated fingers.

2. The SAW filter of claim 1, wherein said resonators are positioned on two substantially separate tracks.

3. A surface acoustic wave (SAW) filter, comprising:
a piezoelectric substrate;
at least two SAW resonators disposed on said piezoelectric substrate, said resonators being symmetrically positioned on two substantially separate tracks, each resonator having a resonant surface acoustic wave structure including a transducer having two conductive portions, the conductive portions including a plurality of interdigitated fingers, the conductive portions being separated from each other by a centrally positioned resonator gap, and being positioned with respect to said resonator gap; and
a multistrip coupler, disposed on said piezoelectric substrate, for acoustically coupling said resonators, said multistrip coupler including a plurality of parallel conductive strips, said conductive strips having an equal spacing between said strips which is substantially equal to a spacing between the equally spaced interdigitated fingers, wherein at least portions of said plurality of said conductive strips are extended between each corresponding resonator gap.

4. The SAW filter of claim 3, wherein each of said conductive portions of said corresponding resonators comprise at least two serially coupled sub-transducers.

5. The SAW filter of claim 4, wherein each of said two serially coupled sub-transducers comprise a first conductive electrode pattern having a first set of fingers, a second conductive electrode pattern having a second set of fingers, and a third conductive electrode pattern having a third set of fingers; wherein at least one of the fingers of the first conductive electrode pattern and at least one of the fingers of the second conductive electrode pattern are positioned between a pair of fingers of the third conductive electrode pattern.

6. A surface acoustic wave (SAW) filter, comprising:
at least two SAW resonators being positioned on two substantially separate and parallel tracks, each resonator having a resonant surface acoustic wave structure including at least two conductive portions with a plurality of equally spaced interdigitated fingers, said conductive portions being separated from each other by a resonator gap; and
a multistrip coupler, disposed on said piezoelectric substrate, for acoustically coupling said resonators including a plurality of equally spaced parallel conductive strips extending between each corresponding resonator gap, the multistrip coupler having opposing sides, said conductive strip being spaced to provide an omni-directional coupling between said resonators such that there is an acoustic propagation track from the opposing sides of said multistrip coupler along the conductive portions of the resonators.

7. The SAW filter of claim 6, wherein each of said resonators includes a respective transducer which comprises the corresponding at least two conductive portions, wherein two of said conductive portions are symmetrically positioned with respect to said resonator gap; and wherein at least portions of said plurality of said conductive strips are extended between each corresponding resonator gap.

8. The SAW filter of claim 7, wherein each of said conductive portions of said corresponding resonators comprise at least two serially coupled sub-transducers.

9. The SAW filter of claim 8, wherein each of said two serially coupled sub-transducers comprise a first conductive electrode pattern having a first set of fingers, a second conductive electrode pattern having a second set of fingers, and a third conductive electrode pattern having a third set of fingers; wherein at least one of the fingers of the first conductive electrode pattern and at least one of the fingers of the second conductive electrode pattern are positioned between a pair of fingers of the third conductive electrode pattern.

10. A radio, comprising:
a radio receiver means for receiving communication signals, said receiver means including a surface acoustic wave structure, comprising:
at least two SAW resonators being positioned on two substantially separate and parallel tracks, each resonator having a resonant surface acoustic wave structure including at least two conductive portions with a plurality of equally spaced interdigitated fingers, said conductive portions being separated from each other by a resonator gap; and
a multistrip coupler, disposed on said piezoelectric substrate, for acoustically coupling said resonators including a plurality of equally spaced parallel conductive strips extending between each corresponding resonator gap, the multistrip coupler having opposing sides, said conductive strip being spaced to provide an omni-directional coupling between said resonators such that there is an acoustic propagation track from the opposing sides of said multistrip coupler along the conductive portions of the resonators.

11. The radio of claim 10, wherein each of said resonators includes a respective transducer which comprises the corresponding at least two conductive portions, wherein two of said conductive portions are symmetrically positioned with respect to said resonator gap; and wherein at least portions of said plurality of said conductive strips are extended between each corresponding resonator gap.

12. The radio of claim 11, wherein each of said conductive portions of said corresponding resonators comprise at least two serially coupled sub-transducers.

13. The radio of claim 12, wherein each of said two serially coupled sub-transducers comprise a first conductive electrode pattern having a first set of fingers, a second conductive electrode pattern having a second set of fingers, and a third conductive electrode pattern having a third set of fingers; wherein at least one of the fingers of the first conductive electrode pattern and at least one of the fingers of the second conductive electrode pattern are positioned between a pair of fingers of the third conductive electrode pattern.

14. The SAW filter of claim 1 wherein each resonator has a resonant frequency having an operative acoustic wavelength, and the spacing between the interdigitated fingers of each resonator is substantially equal to $\frac{1}{2}$ the acoustic wavelength at the resonant frequency.

* * * * *